United States Patent
Nakabayashi et al.

(10) Patent No.: US 7,898,776 B2
(45) Date of Patent: Mar. 1, 2011

(54) TUNNELING MAGNETIC SENSING ELEMENT INCLUDING ENHANCING LAYER HAVING HIGH FE CONCENTRATION IN THE VICINITY OF BARRIER LAYER

(75) Inventors: Ryo Nakabayashi, Niigata-ken (JP); Naoya Hasegawn, Niigata-ken (JP); Masamichi Saito, Niigata-ken (JP); Masahiko Ishizone, Niigata-ken (JP); Yosuke Ide, Niigata-ken (JP); Takuya Seino, Niigata-ken (JP); Kazumasa Nishimura, Niigata-ken (JP)

(73) Assignee: TDK Corporation, Tokyo (JP)

( * ) Notice: Subject to any disclaimer, the term of this patent is extended or adjusted under 35 U.S.C. 154(b) by 871 days.

(21) Appl. No.: 11/880,730

(22) Filed: Jul. 24, 2007

(65) Prior Publication Data
US 2008/0030907 A1 Feb. 7, 2008

(30) Foreign Application Priority Data
Aug. 3, 2006 (JP) ............................. 2006-212237

(51) Int. Cl.
G11B 5/33 (2006.01)
G11B 5/127 (2006.01)
(52) U.S. Cl. ............................ 360/324.2; 360/324.12
(58) Field of Classification Search ............. 360/324.1, 360/324.11, 324.12, 324.2
See application file for complete search history.

(56) References Cited

U.S. PATENT DOCUMENTS

| | | | | |
|---|---|---|---|---|
| 5,966,012 A | * | 10/1999 | Parkin | 324/252 |
| 6,724,585 B2 | * | 4/2004 | Hayashi | 360/324.2 |
| 7,075,759 B2 | * | 7/2006 | Hasegawa et al. | 360/324.12 |
| 7,256,971 B2 | * | 8/2007 | Horng et al. | 360/324.11 |
| 7,283,333 B2 | * | 10/2007 | Gill | 360/324.1 |
| 7,495,868 B2 | * | 2/2009 | Seino et al. | 360/324.11 |
| 7,567,412 B2 | * | 7/2009 | Nakabayashi et al. | 360/324.12 |

(Continued)

FOREIGN PATENT DOCUMENTS

JP 11-121832 4/1999

(Continued)

OTHER PUBLICATIONS

Office Action issued in corresponding Japanese Patent Application No. 2006-212237; issued Dec. 16, 2008, Not translated.

*Primary Examiner*—Brian E Miller
(74) *Attorney, Agent, or Firm*—Brinks Hofer Gilson & Lione (57) ABSTRACT

A tunneling magnetic sensing element is provided, in which an increase in the magnetostriction of a free magnetic layer is reduced and the rate of change in resistance is high. A laminate T1 constituting the tunneling magnetic sensing element includes a portion in which a pinned magnetic layer, a barrier layer, and a free magnetic layer are disposed in that order from the bottom. An enhancing layer disposed on the barrier layer side of the free magnetic layer includes a first enhancing layer on the barrier layer side and a second enhancing layer on the soft magnetic layer side, and the Fe content of a CoFe alloy constituting the first enhancing layer is specified to be larger than the Fe content of the CoFe alloy of the second enhancing layer.

9 Claims, 7 Drawing Sheets

U.S. PATENT DOCUMENTS

| | | | |
|---|---|---|---|
| 7,683,445 B2 * | 3/2010 | Pietambaram et al. | 257/421 |
| 2003/0168673 A1 * | 9/2003 | Yuasa et al. | 257/200 |
| 2005/0168887 A1 * | 8/2005 | Yuasa et al. | 360/324.12 |
| 2006/0110625 A1 * | 5/2006 | Nakabayashi et al. | 428/816 |
| 2007/0139827 A1 * | 6/2007 | Gao et al. | 360/324.2 |
| 2010/0123208 A1 * | 5/2010 | Zhao et al. | 257/421 |

FOREIGN PATENT DOCUMENTS

| | | |
|---|---|---|
| JP | 11-161919 | 6/1999 |
| JP | 2003-31867 | 1/2003 |
| JP | 2003-60263 | 2/2003 |
| JP | 2004-31838 | 1/2004 |
| JP | 2005-191312 | 7/2005 |
| JP | 2006-128410 | 5/2006 |
| JP | 2006-134931 | 5/2006 |

* cited by examiner

TUNNELING MAGNETIC SENSING ELEMENT INCLUDING ENHANCING LAYER HAVING HIGH FE CONCENTRATION IN THE VICINITY OF BARRIER LAYER

RELATED APPLICATIONS

This application claims benefit of priority under 35 U.S.C. §119 to Japanese Patent Application No. 2006-212237 filed on Aug. 3, 2006, which is hereby incorporated by reference.

BACKGROUND

1. Field of the Disclosure

The present disclosure relates to a magnetic sensing element through the use of a tunnel effect, the magnetic sensing element being mounted on a magnetic playback apparatus, e.g., a hard disk apparatus, or other magnetic sensing apparatuses. In particular, the present disclosure relates to a tunneling magnetic sensing element having a high rate of change in resistance ($\Delta R/R$) free from increase in a magnetostriction value $\lambda$ of a free magnetic layer. Additionally, the tunneling magnetic sensing element exhibits excellent magnetic detection sensitivity and stability, as well as a method for manufacturing the tunneling magnetic sensing element.

2. Description of the Related Art

In a tunneling magnetic sensing element (tunneling magnetoresistive element), the resistance is improved by the use of a tunnel effect. When the magnetization of a pinned magnetic layer and the magnetization of a free magnetic layer are antiparallel to each other, it is difficult for a tunnel current to pass through a tunnel barrier layer disposed between the pinned magnetic layer and the free magnetic layer and, thereby, the resistance value becomes a maximum. On the other hand, when the magnetization of the above-described pinned magnetic layer and the magnetization of the free magnetic layer are parallel to each other, the above-described tunnel current becomes easiest-to-pass, and the resistance value becomes a minimum.

Changes in the magnetization of the free magnetic layer under the influence of an external magnetic field in accordance with this principle lead to changes in voltage caused by changes in the electric resistance and so a leakage magnetic field from a recording medium is detected.

In a tunneling magnetic sensing element shown in unexamined Japanese Patent Application Publication No. 11-161919, an interface film is disposed at the interface between a barrier layer and a free magnetic multilayer.

A spin-valve magnetoresistive element is described in each of the following unexamined Japanese Patent Application Publication Numbers: 2005-191312; 2003-060263; 2006-128410; and 11-121832.

The magnetoresistive element shown in unexamined Japanese Patent Application Publication No. 2005-191312 is composed of a laminated film in which a free layer on the side in contact with a spacer is $(Co_{(100-x)}Fe_{(x)})_{(100-y)}Ni_y$ ($15 \leq x \leq 100$, $0 < y < 50$) and a free layer disposed on the side farthest from the spacer is $Ni_{(100-x)}Fe_{(x)}$ ($15 \leq x \leq 25$). In the magnetoresistive element shown in unexamined Japanese Patent Application Publication No. 2003-060263, a thin film insertion layer is disposed as a part of each of a pinned layer and a free layer.

In the magnetoresistive element shown in unexamined Japanese Patent Application Publication No. 2006-128410, two enhancing layers having different magnetostriction coefficients are disposed between a free magnetic layer and a nonmagnetic material layer.

With respect to the magnetoresistive element in unexamined Japanese Patent Application Publication No. 11-121832, it is described that when the Fe content in a CoFe thin film increases, the magnetostriction increases to a positive value and reaches a maximum when the Fe is about 50 atomic percent.

One of the tasks for the tunneling magnetic sensing element is to increase detection sensitivity by obtaining a high rate of change in resistance ($\Delta R/R$), and to improve the characteristics of a playback head.

Figure 6:
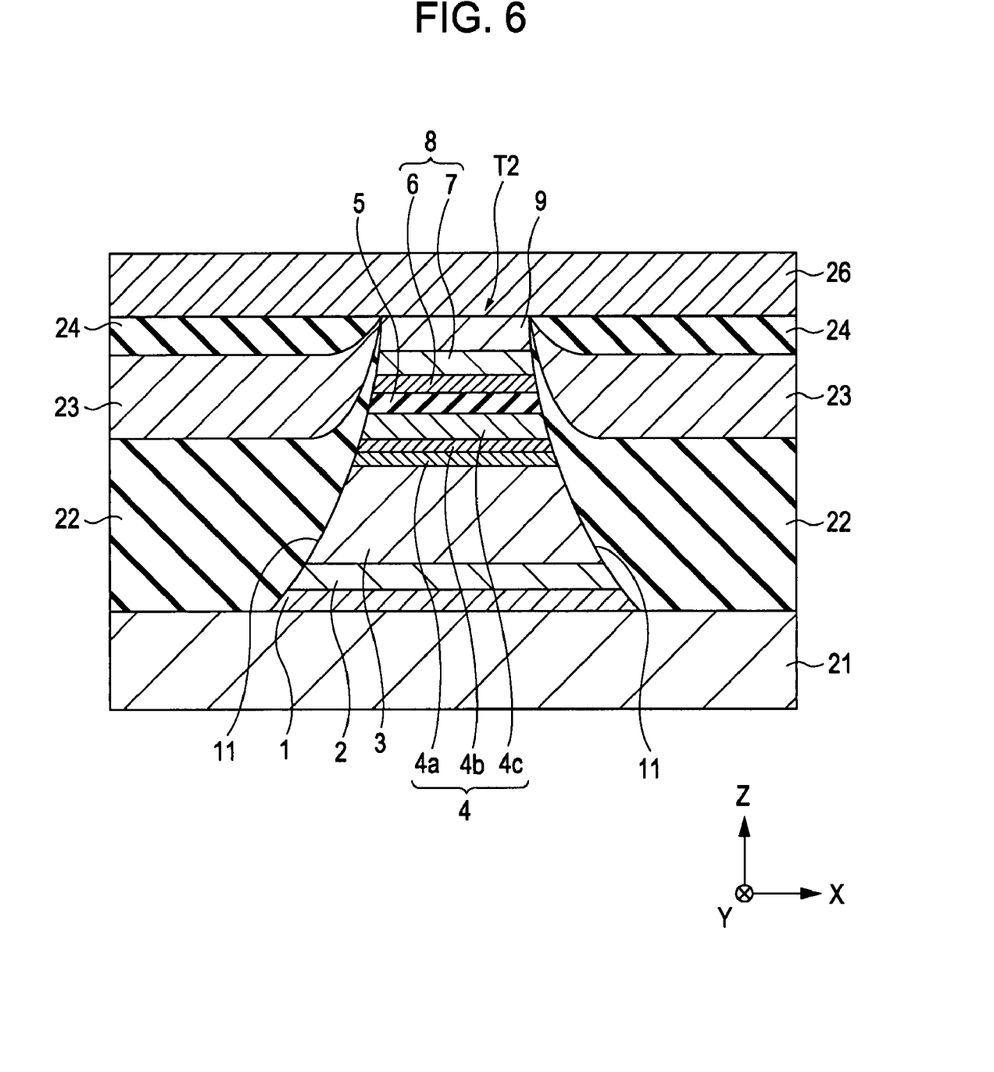
FIG. 6 is a sectional view of a known tunneling magnetic sensing element, cut from a plane parallel to a surface facing a recording medium.

FIG. 6 is a sectional view of a known tunneling magnetic sensing element, cut from a plane parallel to a surface facing a recording medium. In the known tunneling magnetic sensing element, an enhancing layer 6, which is in contact with a barrier layer in a free magnetic layer 8 constituting a laminate T2 is formed from a CoFe alloy. Since the CoFe alloy has a high spin polarizability as compared with that of a NiFe alloy constituting a soft magnetic layer 7 of the free magnetic layer 8, when the enhancing layer 6 formed from the CoFe alloy having a high spin polarizability is disposed on the barrier layer side of the free magnetic layer 8 formed from a NiFe alloy, the rate of change in resistance ($\Delta R/R$) can increase as compared with that in the case where the free magnetic layer 8 is formed from merely the soft magnetic layer 7 composed of the NiFe alloy.

However, according to the known configuration, the value of the rate of change in resistance ($\Delta R/R$) is unsatisfactory, and a further higher rate of change in resistance ($\Delta R/R$) is not achieved while the magnetostriction of the free magnetic layer is controlled at a low level.

Figure 7A:
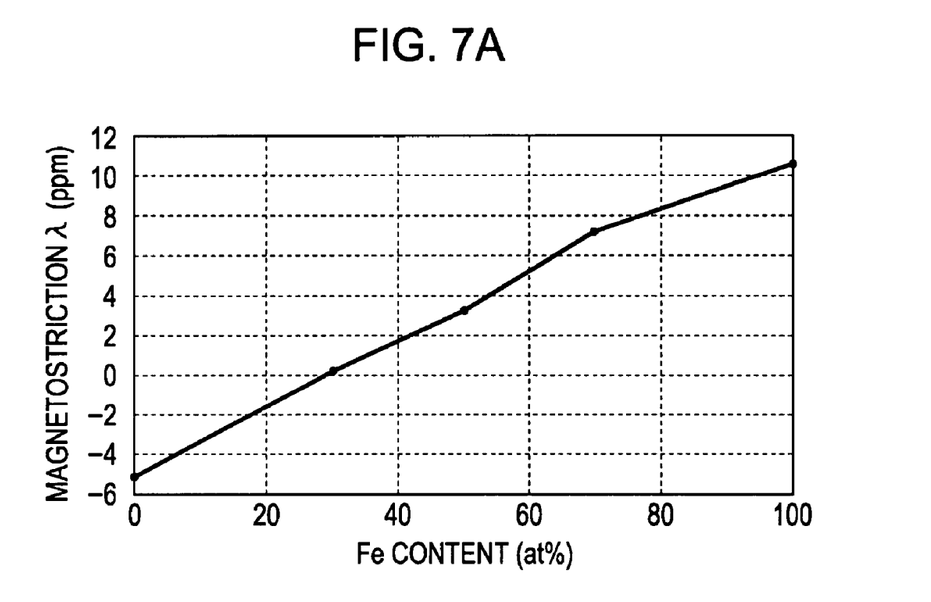
Figure 7B:
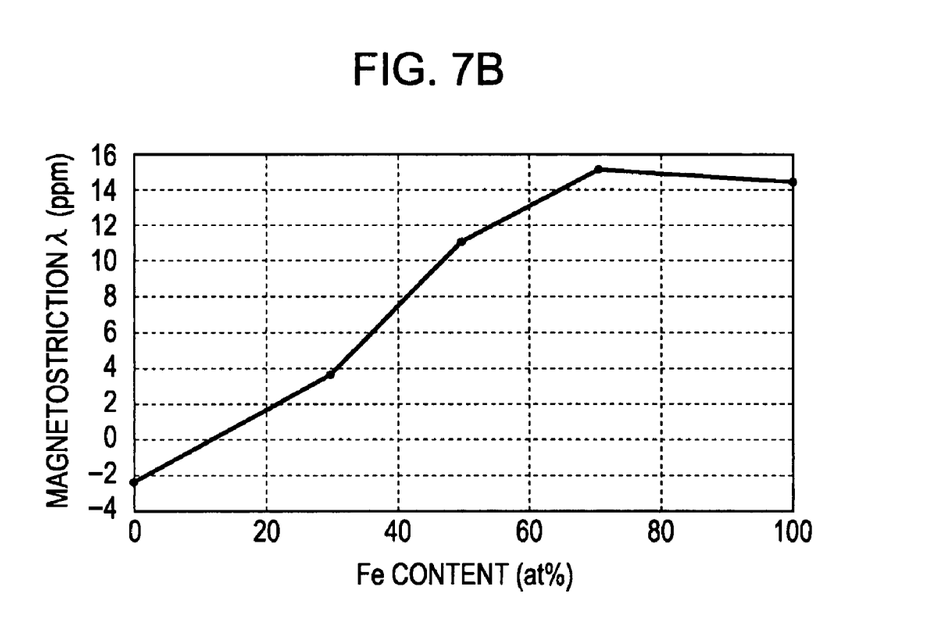

FIGS. 7A and 7B are graphs showing the value of magnetostriction $\lambda$ (ppm) of the free magnetic layer 8 versus the Fe content (atomic percent) of the enhancing layer in the case where the Fe content of the enhancing layer composed of a CoFe alloy changes from 0 to 100 atomic percent, specifically, 0, 30, 50, 70, and 100 atomic percent, with respect to the known tunneling magnetic sensing element shown in FIG. 6. In the basic film configuration of the experiment, the order of lamination is substrate layer 1: Ta (80)/seed layer 2: NiFeCr (50)/antiferromagnetic layer 3: IrMn (70)/pinned magnetic layer 4 first pinned magnetic layer 4a: $Co_{70}Fe_{30}$ (14)/nonmagnetic intermediate layer 4b: Ru (8.5)/second pinned magnetic layer 4c: $Co_{90}Fe_{10}$ (18)]/barrier layer 5 (10)/free magnetic layer 8 enhancing layer 6 (10)/soft magnetic layer 7 (40)]/protective layer 9: Ta (200) from the bottom. A numerical subscript is expressed in atomic percent, and a numerical value in parentheses indicates an average film thickness in Å.

FIG. 7A shows the case where the barrier layer 5 shown in FIG. 6 is titanium oxide (Ti—O), and FIG. 7B shows the case where the barrier layer 5 is aluminum oxide (Al—O). In both cases, the soft magnetic layer 7 constituting the free magnetic layer 8 is formed from NiFe. However, the compositions are different. In the case where the above-described barrier layer 5 is Ti—O, Ni is 86 atomic percent and Fe is 14 atomic percent, and in the case where the above-described barrier layer 5 is Al—O, Ni is 83.5 atomic percent and Fe is 16.5 atomic percent. In the case where the barrier layer 5 is Al—O, the second pinned magnetic layer 4c is $Co_{60}Fe_{20}B_{20}$ on an atomic percent basis.

As is clear from FIGS. 7A and 7B, the magnetostriction $\lambda$ of the free magnetic layer 8 increases as the Fe content of the enhancing layer formed from the CoFe alloy increases (Fe-rich) in the tunneling magnetic sensing element.

Previously, the amount of Fe in the above-described enhancing layer 6 has been controlled at a low concentration of about 10 to 30 atomic percent. This is because the magnetostriction λ (absolute value) of the above-described free magnetic layer 8 can be controlled at a low level, as is also clear from FIGS. 7A and 7B.

However, the above-described rate of change in resistance (ΔR/R) has not been able to be improved effectively.

On the other hand, when the Fe content of the above-described enhancing layer 6 increases, the above-described rate of change in resistance (ΔR/R) can increase. However, as shown in FIGS. 7A and 7B, the magnetostriction λ of the above-described free magnetic layer 8 also increases. If the magnetostriction λ of the above-described free magnetic layer 8 increases, noises are caused in a playback head, and the stability of the playback head deteriorates. Therefore, it is desired that the rate of change in resistance (ΔR/R) increases while the above-described magnetostriction λ (absolute value) is minimized.

As described above, in the known configuration, a high rate of change in resistance (ΔR/R) and a low magnetostriction λ (absolute value) of the above-described free magnetic layer cannot be obtained in combination. The above-described problems are not described in any patent document.

Unexamined Japanese Patent Application Publication No. 11-161919 describes the tunneling magnetic sensing element in which a thin interface film formed from Co or $Co_{(100-x)}Fe_{(x)}$ (20≦x≦70) having a film thickness of 10 to 20 Å is disposed at the interface between an $Al_2O_3$ barrier layer and a sensing ferromagnetic multilayer disposed thereon. It is described that the interface film (enhancing layer) is disposed as a single layer, ferromagnetic films other than the interface film are formed from low magnetostriction materials, e.g., NiFe, and the magnetostriction of the entire sensing ferromagnetic multilayer is adjusted to 0. However, there is no description about the rate of change in resistance, and it is not clear whether a high rate of change in resistance can be obtained, even when the magnetostriction can be decreased.

Unexamined Japanese Patent Application Publication No. 2005-191312 describes that a layer (enhancing layer) having a composition of $(Co_{(100-x)}Fe_{(x)})_{(100-y)}Ni_y$, (15≦x≦100, 0<y<50) is disposed between the free magnetic layer ($Ni_{(100-x)}Fe_{(x)}$ (15≦x≦25)) and the spacer layer, and the composition is adjusted and, thereby, the magnetostriction can be decreased. However, specific values of composition and magnetostriction are not described. Furthermore, the amount of the magnetoresistance (MR) can be increased by changing the material of the free magnetic layer. However, according to the description of Example, when laminated structures (for example, Sample 17, 20, and 23) including the enhancing layer having the above-described composition of $(Co_{(100-x)}Fe_{(x)})_{(100-y)}Ni_y$, (15≦x≦100, 0<y<50) on the spacer layer side of the free magnetic layer are compared, the amount of change in the magnetoresistance (MR) decreases as the Fe content of the above-described enhancing layer increases.

Likewise, unexamined Japanese Patent Application Publication No. 2003-060263 describes that when thin film insertion layers having compositions of $Co_{50}Fe_{50}$, $Co_{90}Fe_{10}$, and the like are inserted in a part of the free magnetic layer, the amount of change in the magnetoresistance increases. However, the amount of change in the magnetoresistance exhibits a maximum value at a Fe content of 50 atomic percent, and decreases as the Fe content increases. Furthermore, there is no description about the magnetostriction.

Unexamined Japanese Patent Application Publication No. 2006-128410 describes that as two enhancing layers are disposed, the Co content of the second enhancing layer is specified to be smaller than the Co content of the first enhancing layer, and the magnetostriction coefficient of the second enhancing layer is specified to be smaller than the magnetostriction coefficient of the first enhancing layer, so as to suppress an increase of the magnetostriction coefficient of the entire free magnetic layer and increase the rate of change in magnetoresistance.

However, unexamined Japanese Patent Application Publication Nos. 2005-191312, 2003-060263, and 2006-128410 relate to spin-valve magnetoresistive elements, and do not relate to the relationship between the Fe content of the enhancing layer formed from Co—Fe and the rate of change in magnetoresistance or the magnetostriction with respect to the tunneling magnetic sensing element.

SUMMARY OF THE DISCLOSURE

The present disclosure is to solve the above-described known problems. In particular, it provides a tunneling magnetic sensing element capable of setting the magnetostriction of a free magnetic layer at a low value and setting the rate of change in resistance (ΔR/R) at a higher value, as well as discloses a method for manufacturing the tunneling magnetic sensing element.

In a tunneling magnetic sensing element according to an aspect of the present disclosure, a first magnetic layer, a barrier layer, and a second magnetic layer are laminated in that order from the bottom, any one of the above-described first magnetic layer and second magnetic layer is a pinned magnetic layer with a pinned magnetization direction, and the other is a free magnetic layer with a magnetization direction being varied by an external magnetic field. The above-described free magnetic layer is composed of a soft magnetic layer and an enhancing layer having a film thickness smaller than that of the soft magnetic layer and is interposed between the above-described soft magnetic and barrier layers. The above-described enhancing layer is formed from a cobalt iron (CoFe) alloy and the Fe content of the enhancing layer on the side of the interface to the barrier layer is larger than the Fe content on the side of the interface to the soft magnetic layer.

In another aspect of the present disclosure, the enhancing region having a large Fe content is disposed on the side in contact with the barrier layer so as to improve the rate of change in resistance (ΔR/R). However, if only the enhancing region having a large Fe content is disposed, the magnetostriction λ of the above-described free magnetic layer increases. Therefore, the above-described enhancing region having a small Fe content is disposed on the side of the interface to the soft magnetic layer in order to decrease the magnetostriction λ. In this manner, the rate of change in resistance (ΔR/R) can increase and, in addition, an increase of the magnetostriction λ of the free magnetic layer can be suppressed as compared with those of the known tunneling magnetic sensing element.

In yet another aspect of the present disclosure, the Fe composition ratio gradually decreases from the interface with the barrier layer toward the interface with the soft magnetic layer. Accordingly, a misfit of crystals in the inside of the enhancing layer can be decreased, and it is possible to effectively increase the rate of change in resistance (ΔR/R) and suppress an increase of the magnetostriction λ of the free magnetic layer.

In another aspect of the present disclosure, the above-described enhancing layer is composed of a laminated structure including at least a first enhancing layer in contact with the barrier layer and a second enhancing layer in contact with the soft magnetic layer, and the Fe content of the above-described first enhancing layer is larger than the Fe contents of the other enhancing layers, including the second enhancing layer.

As described above, the other enhancing layers that are free from contact with the barrier layer are formed from a CoFe alloy having Fe content smaller than the Fe content of the first enhancing layer. Accordingly, the other enhancing layers exhibit an effect of decreasing the magnetostriction λ and thereby suppressing an increase of the magnetostriction λ of the entire free magnetic layer.

In yet another aspect of the present disclosure, the above-described barrier layer is formed from titanium oxide (Ti—O), and the Fe content on the side of the interface to the barrier layer or the Fe content of the first enhancing layer is each between 51 and 99 atomic percent. Furthermore, the Fe content on the side of the interface to the soft magnetic layer or the Fe content of the second enhancing layer may each be between 0 and 50 atomic percent.

In another aspect of the present disclosure, the barrier layer is formed from aluminum oxide (Al—O), and the Fe content on the side of the interface to the above-described barrier layer or the Fe content of the above-described first enhancing layer is each between 40 and 100 atomic percent. Furthermore, the Fe content on the side of the interface to the above-described soft magnetic layer or the Fe content of the above-described second enhancing layer is each between 0 and 40 atomic percent.

In yet another aspect of the present disclosure, the above-described first magnetic layer is a pinned magnetic layer, and the above-described second magnetic layer is a free magnetic layer. That is, the pinned magnetic layer, the barrier layer, the enhancing layer, and the soft magnetic layer are laminated in that order from the bottom. If the above-described enhancing layer is disposed under the above-described barrier layer and an oxidation treatment is performed when the above-described barrier layer is formed, the enhancing region, which has a large Fe content, just below the barrier layer is significantly affected by the oxidation and the spin polarizability of the above-described enhancing layer decreases. Therefore, it is preferable that the enhancing layer is disposed on the barrier layer from the viewpoint of an effective improvement of the rate of change in resistance (ΔR/R).

In an aspect of the present disclosure, the film thickness of the above-described enhancing layer is 6 to 20 Å.

A method for manufacturing a tunneling magnetic sensing element according to an aspect of the present disclosure includes: (a) forming a pinned magnetic layer and forming a metal layer or a semiconductor layer on the pinned magnetic layer; (b) oxidizing the metal layer or the semiconductor layer so as to form a barrier layer; (c) forming an enhancing layer, which is composed of a CoFe alloy and which has a film thickness smaller than the film thickness of a soft magnetic layer to be formed in the following step on the barrier layer such that the enhancing layer is composed of a laminated structure including at least a first enhancing layer in contact with the barrier layer and a second enhancing layer in contact with the soft magnetic layer, and the Fe content of the first enhancing layer is specified to be larger than the Fe contents of the other enhancing layers, to include the second enhancing layer; and (d) forming the soft magnetic layer on the enhancing layer so that a free magnetic layer is composed of the enhancing layer and the soft magnetic layer.

According to the above-described method, a tunneling magnetic sensing element can be produced appropriately and simply that is capable of increasing the rate of change in resistance (ΔR/R) and suppressing an increase of the magnetostriction λ of the free magnetic layer as compared with those of the known tunneling magnetic sensing elements. In particular, since the first enhancing layer having a large Fe content is formed on the above-described barrier layer after the oxidation treatment in the above-described step (b) is performed, the first enhancing layer is not easily affected by the oxidation, and high spin polarizability can be maintained. Consequently, a tunneling magnetic sensing element having a high rate of change in resistance (ΔR/R) described above can be effectively produced.

In the above-described step (a), the total film thickness of the enhancing layer may be specified to be between 6 to 20 Å.

In an aspect of the present disclosure, when the barrier layer is formed from titanium oxide (Ti—O), the Fe content of the first enhancing layer may be specified to be between 51 and 100 atomic percent and the Fe content of the second enhancing layer is specified to be between 0 and 50 atomic percent.

In an aspect of the present disclosure, when the above-described barrier layer is formed from aluminum oxide (Al—O), the Fe content of the first enhancing layer may be specified to be between 40 and 100 atomic percent and, furthermore, the Fe content of the second enhancing layer is specified to be between 0 and 40.

In another aspect of the present disclosure, an annealing treatment is performed after the above-described step (d) is performed. According to this annealing treatment, mutual diffusion of Fe and Co occurs at each interface of laminated enhancing layers, and a concentration gradient of Fe can be generated such that the Fe content decreases gradually from the side of the interface to the above-described barrier layer toward the side of the interface to the above-described soft magnetic layer. In this manner, misfit of crystals in the inside of the enhancing layer can be decreased, and a tunneling magnetic sensing element may be effectively produced that has a high rate of change in resistance (ΔR/R) and is capable of suppressing an increase of the magnetostriction λ of the free magnetic layer.

The tunneling magnetic sensing element according to an aspect of the present disclosure can increase the rate of change in resistance (ΔR/R) without increasing the magnetostriction λ of the free magnetic layer.

BRIEF DESCRIPTION OF THE DRAWINGS

FIGS. 7A and 7B are graphs showing the relationship between the Fe content of a CoFe alloy constituting the enhancing layer and the magnetostriction of the free magnetic layer with respect to the known tunneling magnetic sensing element, wherein FIG. 7A is for a barrier layer formed from TiOx, and FIG. 7B for a barrier layer formed from AlOx.

DETAILED DESCRIPTION

Figure 1:
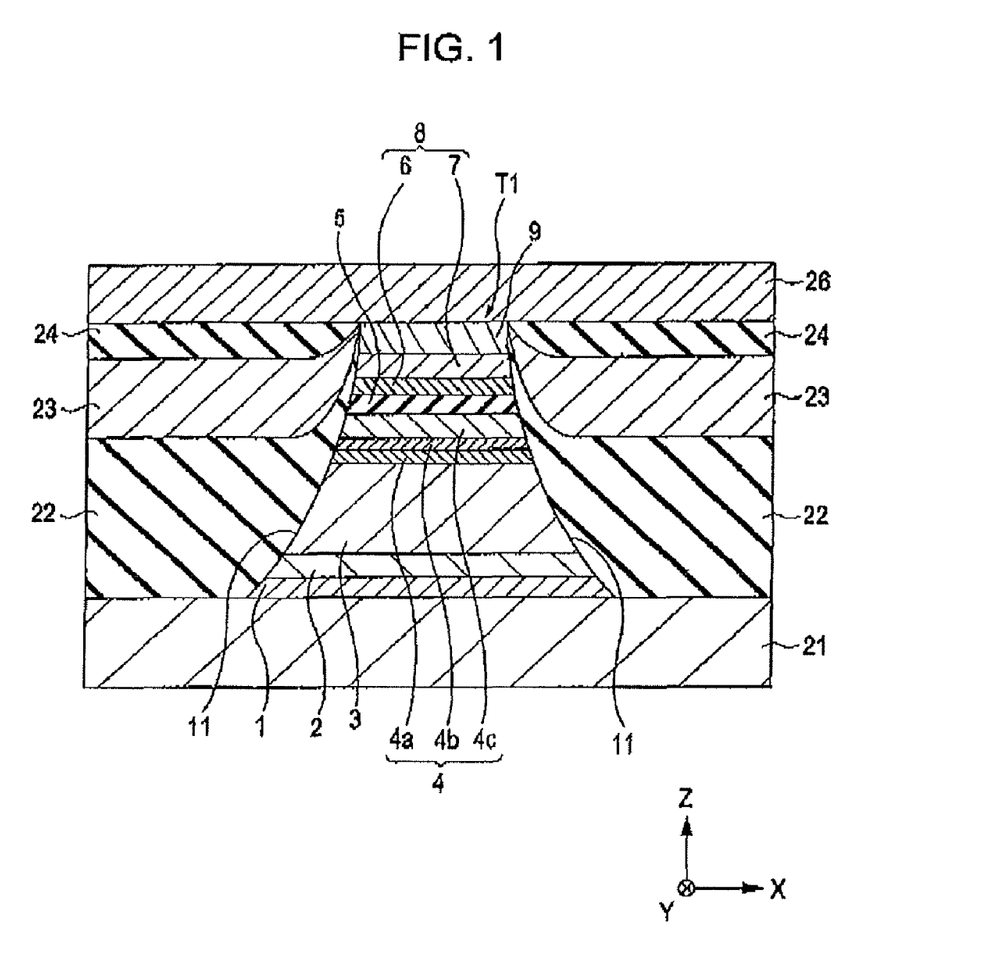
FIG. 1 is a sectional view of a tunneling magnetic sensing element according to an embodiment of the present disclosure, cut from a plane parallel to a surface facing a recording medium.

FIG. 1 is a sectional view of a tunneling magnetic sensing element, specifically a tunneling magnetoresistive element, according to an embodiment of the present disclosure that is cut from a plane parallel to a surface facing a recording medium.

The tunneling magnetic sensing element is disposed on a trailing side end portion or the like of a flying slider disposed in a hard disk apparatus and detects a recording magnetic field of a hard disk or the like. In the drawing, the X direction is a track width direction, the Y direction is a direction of a leakage magnetic field from a magnetic recording medium (height direction), and the Z direction is a movement direction of the magnetic recording medium, e.g., a hard disk, and a lamination direction of each layer of the above-described tunneling magnetic sensing element.

In FIG. 1, a lower shield layer 21 formed from, for example, a NiFe alloy is disposed as the lowermost portion. A laminate T1 is disposed on the above-described lower shield layer 21. The above-described tunneling magnetic sensing element is composed of the above-described laminate T1, lower insulating layers 22, hard bias layers 23, and upper insulating layers 24, which are disposed on both sides of the above-described laminate T1 in a track width direction (the X direction shown in the drawing).

The lowermost layer of the above-described laminate T1 is a substrate layer 1 formed from a nonmagnetic material, e.g., at least one of Ta, Hf, Nb, Zr, Ti, Mo, and W. A seed layer 2 is disposed on the substrate layer 1. The above-described seed layer 2 is formed from NiFeCr or Cr. When the above-described seed layer 2 is formed from NiFeCr, the above-described seed layer 2 has a face-centered cubic (fcc) structure, and equivalent crystal faces represented as a {111} face are preferentially oriented in a direction parallel to the film surface. When the above-described seed layer 2 is formed from Cr, the above-described seed layer 2 has a body-centered cubic (bcc) structure, and equivalent crystal faces represented as a {110} face are preferentially oriented in a direction parallel to the film surface. The above-described substrate layer 1 may not be disposed.

An antiferromagnetic layer 3 disposed on the above-described seed layer 2 may be formed from an antiferromagnetic material containing an element X (where X represents at least one of Pt, Pd, Ir, Rh, Ru, and Os) and Mn.

The X—Mn alloys including platinum group elements have excellent properties as antiferromagnetic materials. For example, excellent corrosion resistance is exhibited, the blocking temperature is high, and the exchange coupling field (Hex) can be increased.

The above-described antiferromagnetic layer 3 may be formed from an antiferromagnetic material containing the element X, an element XI (where XI represents at least one of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements), and Mn.

A pinned magnetic layer 4 is disposed on the above-described antiferromagnetic layer 3. The pinned magnetic layer 4 has a laminated ferri-structure in which a first pinned magnetic layer 4a, a nonmagnetic intermediate layer 4b, and a second pinned magnetic layer 4c are laminated in that order from the bottom. The magnetization direction of the above-described first pinned magnetic layer 4a and the magnetization direction of the second pinned magnetic layer 4c are brought into the state of being antiparallel to each other by the exchange coupling field at the interface to the antiferromagnetic layer 3 and an antiferromagnetic exchange coupling field (RKKY interaction) through the nonmagnetic intermediate layer 4b. This is a so-called laminated ferri-structure. By this configuration, the magnetization of the above-described pinned magnetic layer 4 can be brought into a stable state, and an exchange coupling field generated at the interface between the pinned magnetic layer 4 and the antiferromagnetic layer 3 can be increased. The first pinned magnetic layer 4a and the second pinned magnetic layer 4c are formed to become, for example, about 12 to 24 Å, and the nonmagnetic intermediate layer 4b is formed to become about 8 to 10 Å.

The above-described first pinned magnetic layer 4a and the second pinned magnetic layer 4c are formed from a ferromagnetic material, e.g., CoFe, NiFe, and/or CoFeNi. The nonmagnetic intermediate layer 4b is formed from a nonmagnetic electrically conductive material, e.g., Ru, Rh, Ir, Cr, Re, and/or Cu.

A barrier layer 5 disposed on the above-described pinned magnetic layer 4 may be formed from titanium oxide (Ti—O) or aluminum oxide (Al—O). The above-described barrier layer 5 may be formed by sputtering through the use of a target composed of Ti—O or Al—O. However, it is preferable that Ti or Al is formed into a film having a thickness of 1 to 10 Å and, thereafter, oxidation is performed so as to produce Ti—O or Al—O. In this case, although the film thickness increases by oxidation, the film thickness of the barrier layer 5 is preferably between about 1 to 20 Å. If the film thickness of the barrier layer 5 is too large, unfavorably, a tunnel current becomes difficult to pass.

A free magnetic layer 8 is disposed on the barrier layer 5. The free magnetic layer 8 is composed of a soft magnetic layer 7 formed from a magnetic material, e.g., a NiFe alloy, and an enhancing layer 6 formed from a CoFe alloy between the soft magnetic layer 7 and the barrier layer 5. The soft magnetic layer 7 may be formed from a magnetic material having an excellent soft magnetic property. The enhancing layer 6 may be formed from a magnetic material having a spin polarizability larger than that of the soft magnetic layer 7. The rate of change in resistance ($\Delta R/R$) can be improved by forming the above-described enhancing layer 6 from the CoFe alloy having a large spin polarizability. If the enhancing layer 6 is formed to have a film thickness that is too large, the magnetism detection sensitivity of the soft magnetic layer 7 is affected and deterioration of the detection sensitivity results. Therefore, the enhancing layer 6 is formed to have a film thickness smaller than that of the soft magnetic layer 7. The soft magnetic layer 7 is formed to become, for example, between about 30 to 70 Å, and the enhancing layer 6 is formed to become about 10 Å. The total film thickness of the enhancing layer may be between about 6 to 20 Å.

In the case where the soft magnetic layer 7 is formed from NiFe alloy, the Ni content may be between about 81.5 to 100 atomic percent from the viewpoint of the magnetic properties.

As show in FIG. 1, the enhancing layer 6 is formed from a first enhancing layer 6a in contact with the barrier layer 5 and a second enhancing layer 6b in contact with the soft magnetic layer 7. The enhancing layer 6 may be formed from CoFe alloy, and the Fe content of the first enhancing layer 6a is larger than the Fe content of the second enhancing layer 6b. The enhancing layer will be described later in detail.

The free magnetic layer 8 may have a laminated ferristructure in which a plurality of magnetic layers are laminated with nonmagnetic intermediate layers therebetween.

The track width Tw is determined by a width dimension of the free magnetic layer 8 in the track width direction (the X direction shown in the drawing).

A protective layer 9 formed from Ta or the like is disposed on the above-described free magnetic layer 8.

Both side end surfaces 11 of the laminate T1 in the track width direction (the X direction shown in the drawing) are formed from inclined surfaces such that the width dimension in the track width direction gradually decreases from the lower side toward the upper side.

As shown in FIG. 1, the lower insulating layers 22 are disposed over the lower shield layers 21 extending toward both sides of the above-described laminate T1 and both side end surfaces 11 of the laminate T1. Hard bias layers 23 are disposed on the lower insulating layers 22 and, furthermore, the upper insulating layers 24 are disposed on the hard bias layers 23.

A bias substrate layer (not shown) may be disposed between the lower insulating layer 22 and the hard bias layer 23. The bias substrate layer is formed from, for example, Cr, W, or Ti.

The insulating layers 22 and 24 are formed from an insulating material, e.g., $Al_2O_3$ or $SiO_2$ and insulate the portion above the hard bias layer from the portion under the hard bias layer in order to prevent the current passing through the laminate T1 in a direction perpendicular to the interfaces of individual layers from diverting to both sides of the laminate T1 in the track width direction. The hard bias layer 23 is formed from, e.g., a cobalt-platinum (Co—Pt) alloy or a cobalt-chromium-platinum (Co—Cr—Pt) alloy.

An upper shield layer 26 formed from a NiFe alloy or the like is disposed on the laminate T1 and the upper insulating layer 24.

In the embodiment shown in FIG. 1, the lower shield layer 21 and the upper shield layer 26 function as electrode layers relative to the laminate T1, and the current passes in a direction perpendicular to the film surfaces of the individual layers of the laminate T1 (a direction parallel to the Z direction shown in the drawing).

The free magnetic layer 8 is magnetized in a direction parallel to the track width direction (the X direction) by a bias magnetic field from the hard bias layer 23. On the other hand, the first pinned magnetic layer 4a and the second pinned magnetic layer 4c constituting the pinned magnetic layer 4 are magnetized in a direction parallel to the height direction (the Y direction). Since the pinned magnetic layer 4 has a laminated ferri-structure, the first pinned magnetic layer 4a and the second pinned magnetic layer 4c are magnetized antiparallel to each other. The magnetization of the above-described pinned magnetic layer 4 is pinned (the magnetization is not varied by an external magnetic field). However, the magnetization of the free magnetic layer 8 is varied by an external magnetic field.

When the magnetization of the free magnetic layer 8 is varied by an external magnetic field and the magnetization of the second pinned magnetic layer 4c and the magnetization of the free magnetic layer 8 are antiparallel to each other, a tunnel current is difficult to pass through the barrier layer 5 disposed between the second pinned magnetic layer 4c and the free magnetic layer 8, and the resistance value becomes a maximum. On the other hand, when the magnetization of the second pinned magnetic layer 4c and the magnetization of the free magnetic layer 8 are parallel to each other, the tunnel current becomes easiest-to-pass, and the resistance value becomes a minimum.

Changes in the magnetization of the free magnetic layer under the influence of an external magnetic field in accordance with this principle lead to changes in voltage caused by changes in the electric resistance and, thereby, a leakage magnetic field from a recording medium is detected.

As shown in FIG. 1, the tunneling magnetic sensing element has features such that the enhancing layer 6 is formed from two layers of the first enhancing layer 6a in contact with the barrier layer 5, the second enhancing layer 6b is in contact with the soft magnetic layer 7, and the Fe content of the first enhancing layer 6a is higher than the Fe content of the second enhancing layer 6b.

The enhancing layer 6 may be formed from the CoFe alloy as before. However, since the Fe content of the first enhancing layer 6a disposed at the interface to the barrier layer 5 is large, the spin polarizability is larger than that of the second enhancing layer 6b. The layer having such a high spin polarizability is disposed in contact with the interface to the barrier layer 5 and, thereby, the rate of change in resistance ($\Delta R/R$) can be increased effectively.

On the other hand, the magnetostriction $\lambda$ of the free magnetic layer 8 increased by disposing the first enhancing layer 6a having a large Fe content is minimized by the second enhancing layer 6b which is disposed on the side of the interface to the soft magnetic layer 7 and which has a small Fe content.

For example, in order to suppress the increased magnetostriction $\lambda$ of the free magnetic layer 8, it has been proposed to change the material of the soft magnetic layer 7. However, this leads to deterioration of the playback sensitivity or the like of the free magnetic layer 8 due to deterioration of the soft magnetic properties. Therefore, the soft magnetic layer 7 does not change. In order to suppress the magnetostriction $\lambda$ of the free magnetic layer 8, the second enhancing layer 6b having a Fe composition ratio smaller than that of the first enhancing layer 6a is disposed at a position apart from the interface to the above-described barrier layer 5, so that the magnetostriction $\lambda$ of the above-described free magnetic layer 8 is suppressed.

The second enhancing layer 6b has a spin polarizability larger than that of the soft magnetic layer 7. That is, the second enhancing layer 6b has a spin polarizability between those of the first enhancing layer 6a and the soft magnetic layer 7. Therefore, a high rate of change in resistance ($\Delta R/R$) can be maintained even when the second enhancing layer 6b is inserted.

The enhancing layer 6 is not limited to two layers, and may be composed of three or more layers. For example, the enhancing layer 6 can be composed of three layers such that the Fe content of a CoFe alloy on the barrier layer 5 side is made to be the highest and the Fe contents of CoFe alloys sequentially decreases as the proximity to the soft magnetic layer 7 increases.

The tunneling magnetic sensing element is subjected to an annealing treatment (heat treatment) in the manufacturing process, as described below. The annealing treatment is performed at a temperature of 240° C. to 310° C. It is believed that when the annealing time is less than 4 hours, the laminated structure is principally maintained. It is believed that if the annealing time is 4 hours or more, or the annealing temperature is higher than 310° C., mutual diffusion occurs at each interface of the laminated structure due to the heat treatment.

In particular, the enhancing layer 6 has a small thickness of about 10 Å, and the Fe (or Co) contents of the first enhancing layer 6a and the second enhancing layer 6b are different. Consequently, Fe diffuses from the first enhancing layer 6a having a large Fe content to the second enhancing layer 6b having a small Fe content, and Co diffuses from the second enhancing layer 6b having a large Co content to the first enhancing layer 6a having a small Co content. That is, Co and Fe mutually diffuse between the first enhancing layer 6a and the second enhancing layer 6b. As a result, the interface between the first enhancing layer 6a and the second enhancing layer 6b becomes obscure, and a single layer of the enhancing layer 6 is formed, in which each of Fe and Co has a concentration gradient such that the Fe content is large (Co content is small) on the side of the interface to the barrier layer 5, and the Co content is large (Fe content is small) on the side of the interface to the soft magnetic layer 7.

Figure 2:
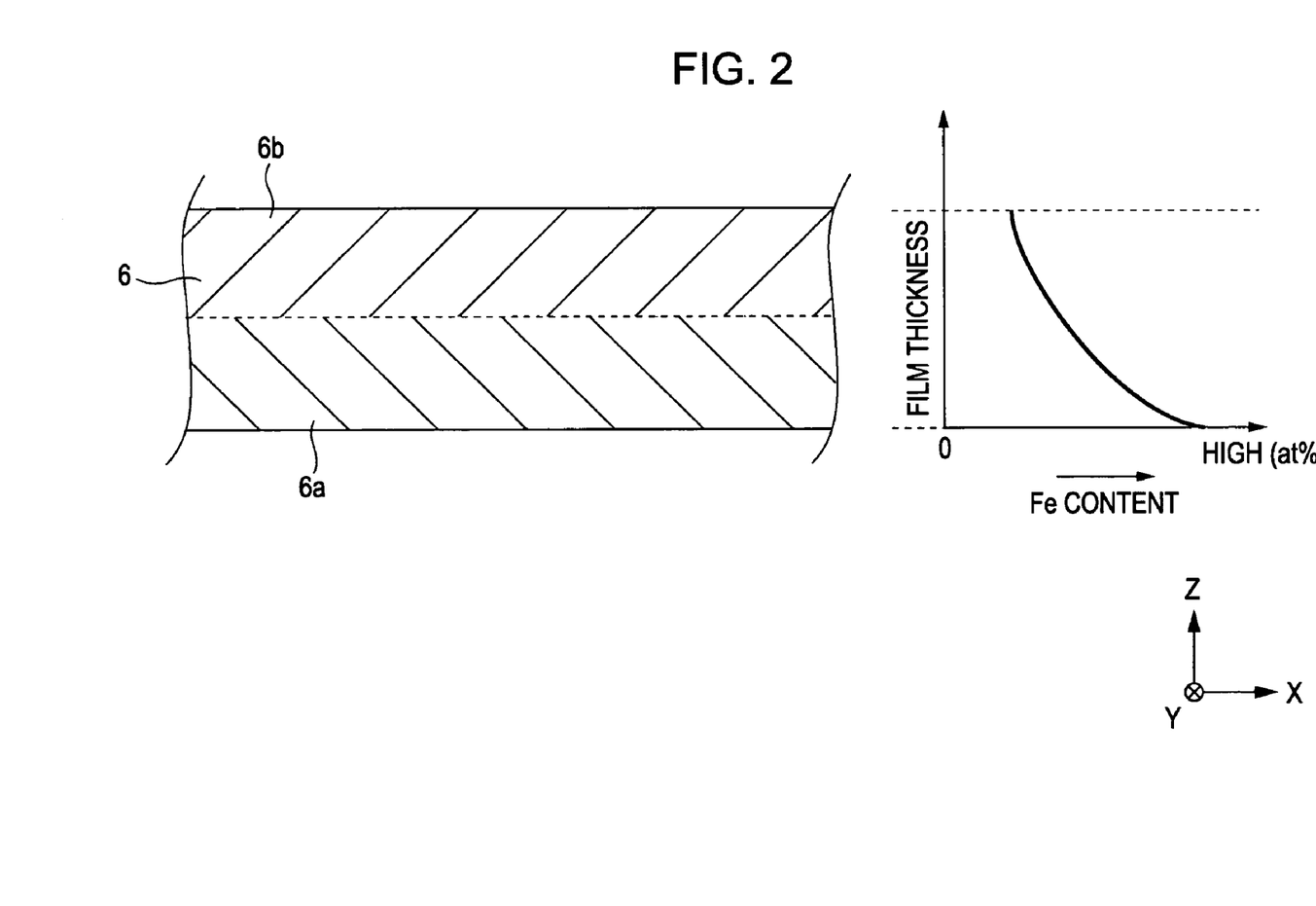
FIG. 2 is a magnified partial sectional view showing an enhancing layer according to an embodiment of the present disclosure and a graph showing the relationship between the position in the film thickness direction and the Fe content.

FIG. 2 schematically shows the concentration gradient of the Fe content in the CoFe alloy in the enhancing layer 6. The left diagram shown in FIG. 2 is a magnified diagram of the enhancing layer 6 shown in FIG. 1, and the right diagram shown in FIG. 2 is a graph in which the horizontal axis indicates the Fe content (atomic percent) and the vertical axis indicates the position in the film thickness direction of the enhancing layer 6 shown in the left diagram.

As shown in FIG. 2, the Fe content has a concentration gradient in which the Fe content is high on the lower surface side, that is, the side of the interface to the barrier layer 5 and gradually decreases as the proximity to the upper surface, that is, to the soft magnetic layer 7, increases. Although not shown in FIG. 2, in contrast to the Fe content, the Co content has a concentration gradient in which the Co content in the CoFe alloy is the highest on the soft magnetic layer 7 side and gradually decreases as the proximity to the barrier layer 5 increases.

Even when the annealing time is less than four hours and it is believed that the laminated structure is principally maintained, it is estimated that the mutual diffusion of Co and Fe occurs locally at the interface between the first and second enhancing layers 6a and 6b.

The crystal structure of the CoFe alloy is different depending on the Fe (or Co) content. The CoFe alloy having a small Fe content exhibits a face-centered cubic (fcc) structure, and equivalent crystal faces represented as a {111} face are preferentially oriented in a direction parallel to the film surface. The CoFe alloy having a large Fe content exhibits a body-centered cubic (bcc) structure, and equivalent crystal faces represented as a {110} face are preferentially oriented in a direction parallel to the film surface.

The barrier layer 5 may be formed from titanium oxide (Ti—O) or aluminum oxide (Al—O), and is amorphous. The first enhancing layer 6a disposed on the barrier layer 5 is the CoFe alloy having a large Fe content and exhibits a body-centered cubic (bcc) structure. The CoFe alloy constituting the second enhancing layer 6b has a large Co content and exhibits a face-centered cubic (fcc) structure. Furthermore, the soft magnetic layer 7 disposed on the second enhancing layer 6b is formed from a magnetic material, e.g., a NiFe alloy, and exhibits a face-centered cubic (fcc) structure similarly to the second enhancing layer 6b.

The crystal structures of the barrier layer 5 and the free magnetic layer 8 are laminated in the order of amorphous/body-centered cubic (bcc)/face-centered cubic (fcc)/face-centered cubic (fcc) from the bottom.

As described above, misfit of atoms between crystals (deterioration of lattice matching property) tends to occur at the interface between different crystal structures. However, it is believed that in a form in which the annealing treatment is performed and the Fe content is gradually varied, rearrangement of atoms occurs at the above-described interface, a transition region is derived so as to perform the transition from body-centered cubic (bcc) to face-centered cubic (fcc), the misfit is controlled at a low level, and as a result, the rate of change in resistance ($\Delta R/R$) can be improved and the magnetostriction $\lambda$ of the free magnetic layer 8 can be effectively controlled at a low level.

Since both the second enhancing layer 6b and the soft magnetic layer 7 have the face-centered cubic structure, a good lattice matching property is exhibited.

The entirety of the above-described barrier layer 5 may not be amorphous, and a part of the layer may be amorphous. In particular, in the case where the barrier layer 5 is titanium oxide (Ti—O), a body-centered cubic structure, a body-centered tetragonal structure, or a rutile structure is formed, and the lattice matching property with the first enhancing layer 6a is improved. Therefore, the rate of change in resistance ($\Delta R/R$) can be improved and the magnetostriction $\lambda$ of the free magnetic layer 8 can be effectively controlled at a low level.

The enhancing layer 6 may have a Fe concentration (content) higher than that of the pinned magnetic layer 4. When the Fe concentration of the enhancing layer 6 is high, oxygen in the vicinity of the interface of the pinned magnetic layer 4 to the barrier layer 5 is attracted to the side of the enhancing layer 6 having a higher Fe concentration. Consequently, a reduction phenomenon occurs in the pinned magnetic layer 4 and the spin polarizability can be improved appropriately. Furthermore, when the Fe concentration of the first enhancing layer 6a located on the barrier layer 5 side in the enhancing layer 6 increases, oxygen in the pinned magnetic layer 4 is further attracted to the enhancing layer 6 side and, thereby, oxidation of the pinned magnetic layer 4 is suppressed, exhibiting a high effect of improving the spin polarizability.

In a tunneling magnetic sensing element of the first embodiment, the barrier layer 5 shown in FIG. 1 is formed from titanium oxide (Ti—O).

In the first embodiment, the above-described enhancing layer 6 is formed from a CoFe alloy, the Fe content of the first enhancing layer 6a is between 51 and 100 atomic percent, and the Fe content of the second enhancing layer 6b is between 0 and 50 atomic percent. Therefore, the first enhancing layer 6a is formed from a CoFe alloy or Fe. The second enhancing layer 6b is formed from a CoFe alloy or Co.

In a tunneling magnetic sensing element of the second embodiment, the barrier layer 5 shown in FIG. 1 is formed from alumina (Al—O).

In the second embodiment, the enhancing layer 6 is formed from a CoFe alloy, the Fe content of the first enhancing layer 6a is between 40 and 100 atomic percent, and the Fe content of a CoFe alloy of the second enhancing layer 6b is between 0 and 40 atomic percent. Therefore, the first enhancing layer 6a is formed from a CoFe alloy or Fe. The second enhancing layer 6b is formed from a CoFe alloy or Co.

In the case where the above-described barrier layer 5 is Al—O, the Fe content of the CoFe alloy of the first enhancing layer 6a is between 40 and 100 atomic percent. Therefore, a CoFe alloy having a Fe content smaller than a Co content (a CoFe alloy having a Fe content of between 40 and 49 atomic percent) is also included. When the Fe content of the first enhancing layer 6a is larger than the Fe content of the second enhancing layer 6b, the case where the Fe content of the first enhancing layer 6a is smaller than the Co content is also included. From the viewpoint of the Fe content of the entirety of the enhancing layer 6, in the case where the barrier layer 5 is Al—O, an effect of improving the rate of change in resistance (ΔR/R) without increasing the magnetostriction λ of the free magnetic layer 8 is exerted, even when the Fe content of the entirety of the enhancing layer 6 is small, as compared with the case where the barrier layer 5 is Ti—O. This is at least because the substance constituting the above-described barrier layer 5 is different, e.g. Al—O or Ti—O, and the crystal structure of the enhancing layer 6 disposed thereon is affected by the substance.

In the present embodiment, the magnetostriction λ of the free magnetic layer 8 can be controlled within the range of about 2 to 4 ppm.

In the form shown in FIG. 1, the antiferromagnetic layer 3, the pinned magnetic layer 4, the barrier layer 5, and the free magnetic layer 8 are laminated in that order from the bottom. However, the free magnetic layer 8, the barrier layer 5, the pinned magnetic layer 4, and the antiferromagnetic layer 3 may be laminated in that order from the bottom. In the latter case, the enhancing layer 6 is disposed on the barrier layer 5 side of the free magnetic layer 8.

Alternatively, a dual type tunneling magnetic sensing element may be produced, in which a lower antiferromagnetic layer, a lower pinned magnetic layer, a lower barrier layer, a free magnetic layer, an upper barrier layer, an upper pinned magnetic layer, and an upper antiferromagnetic layer are laminated in that order from the bottom.

However, in a single type tunneling magnetic sensing element, at least the pinned magnetic layer 4, the barrier layer 5, and the free magnetic layer 8 may be laminated in that order. In the present embodiment, the Fe composition ratio of the first enhancing layer 6a is set at a high value. If a layer having such a high Fe composition ratio is disposed just below the barrier layer 5, the first enhancing layer 6a is affected by the oxidation treatment in the formation of the barrier layer 5, the spin polarizability decreases, and the rate of change in resistance (ΔR/R) cannot be improved effectively.

When the Fe content of the second pinned magnetic layer 4c in contact with the barrier layer 5 is made smaller than the Fe content of the first enhancing layer 6a, the second pinned magnetic layer 4c is difficult to be oxidized even when being disposed just below the barrier layer 5. Furthermore, even when the second pinned magnetic layer 4c is oxidized to some extent, the first enhancing layer 6a having a large Fe content attracts oxygen from the pinned magnetic layer 4 side, as described above. Consequently, when the pinned magnetic layer 4, the barrier layer 5, and the free magnetic layer 8 are laminated in that order, both the spin polarizability of the second pinned magnetic layer 4c and the spin polarizability of the enhancing layer 6 can be improved. The rate of change in resistance (ΔR/R) can also be effectively improved.

Figure 3:
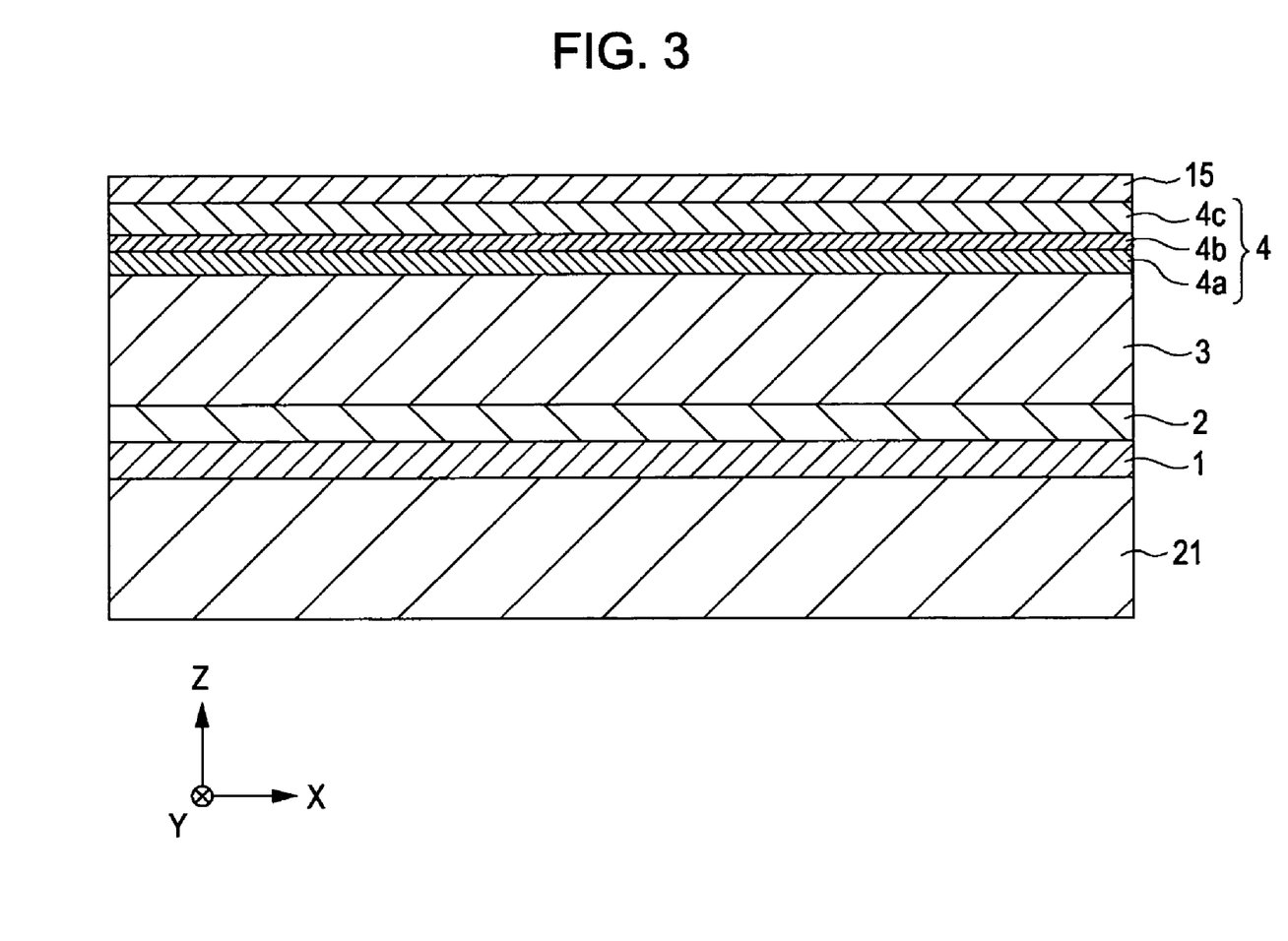
FIG. 3 is a diagram showing a step in a method for manufacturing a tunneling magnetic sensing element according to an embodiment of the present disclosure, which displays a sectional view of the above-described tunneling magnetic sensing element in a manufacturing step, cut from a plane parallel to a surface facing a recording medium.
Figure 4:
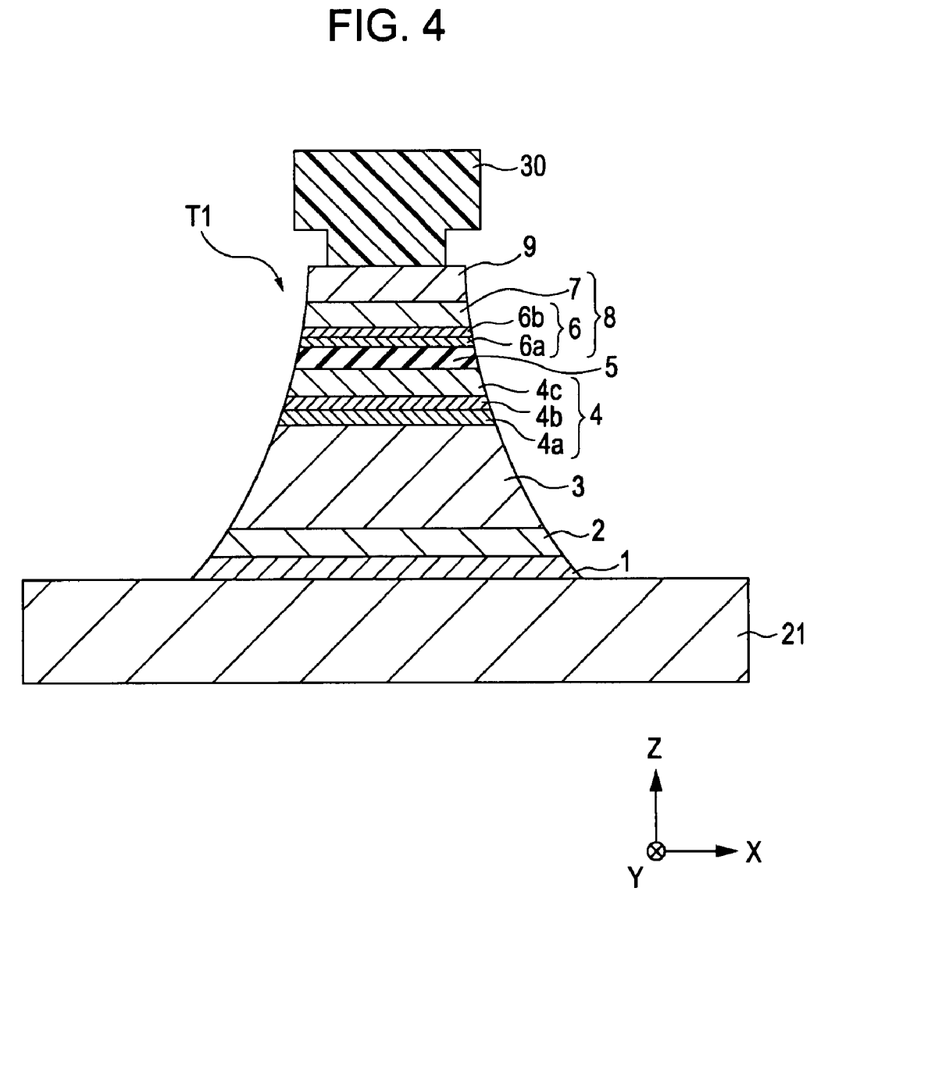
FIG. 4 is a diagram showing a step following the step shown in FIG. 3, displaying a sectional view of the above-described tunneling magnetic sensing element in a manufacturing step, cut from a plane parallel to a surface facing a recording medium.
Figure 5:
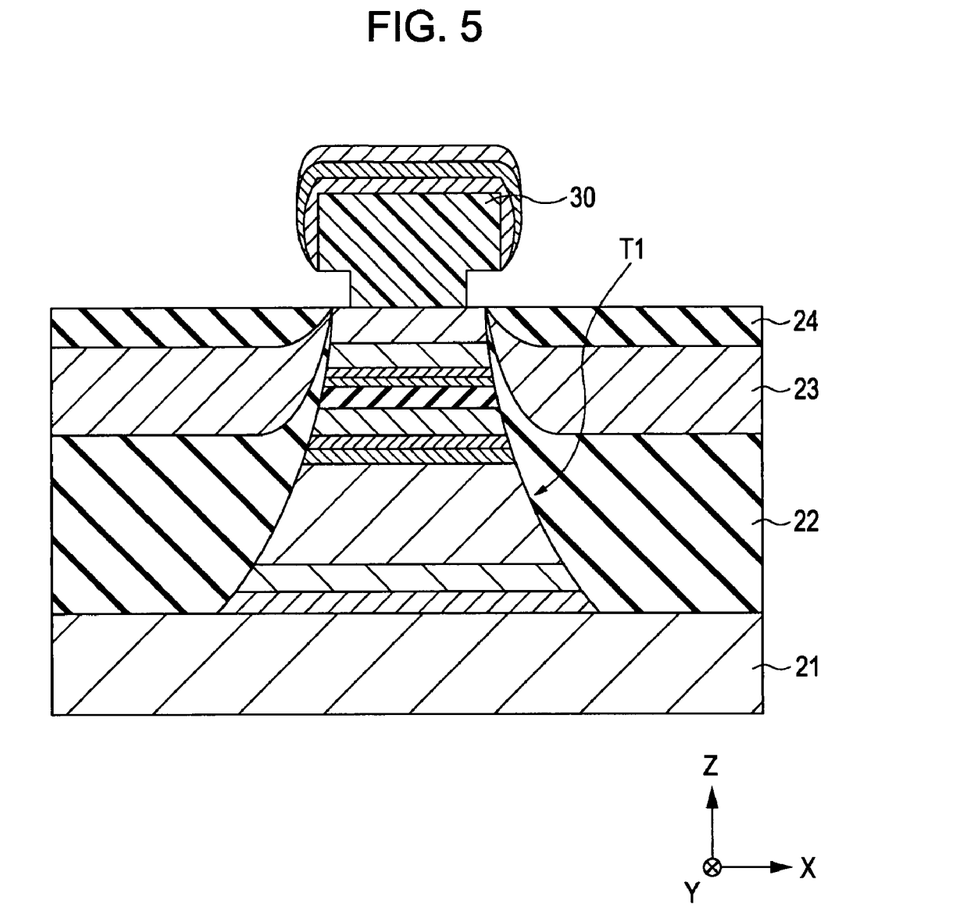
FIG. 5 is a diagram showing a step following the step shown in FIG. 4, displaying a sectional view of the above-described tunneling magnetic sensing element in a manufacturing step, cut from a plane parallel to a surface facing a recording medium.

A method for manufacturing a tunneling magnetic sensing element of the present embodiment will be described. FIG. 3 to FIG. 5 are partial sectional views of the tunneling magnetic sensing element in a manufacturing step, cut from the same plane as in FIG. 1.

In the step shown in FIG. 3, films of a substrate layer 1, a seed layer 2, an antiferromagnetic layer 3, a first pinned magnetic layer 4a, a nonmagnetic intermediate layer 4b, and a second pinned magnetic layer 4c are successively formed on a lower shield layer 21.

A metal layer 15 is formed by a sputtering method or the like on the second pinned magnetic layer 4c. Since the metal layer 15 is oxidized in the downstream step, the metal layer 15 is formed such that the film thickness after the oxidation becomes equal to the film thickness of the barrier layer 5.

Subsequently, oxygen is allowed to flow into a vacuum chamber. According to this, the metal layer 15 is oxidized, and the barrier layer 5 is formed. A semiconductor layer may be formed in place of the metal layer 15, and the semiconductor layer may be oxidized so as to form the barrier layer 5.

Films of the free magnetic layer 8 composed of the first enhancing layer 6a, the second enhancing layer 6b, and the soft magnetic layer 7 and the protective layer 9 are formed on the barrier layer 5. In this manner, the laminate T1 is formed in which from the substrate layer 1 to the protective layer 9 are laminated.

A lift-off resist layer 30 is formed on the laminate T1. Both side end portions, which are not covered with the lift-off resist layer 30, of the laminate T1 in the track width direction (the X direction shown in the drawing) are removed by etching or the like (refer to FIG. 4).

The lower insulating layer 22, the hard bias layer 23, and the upper insulating layer 24 are laminated in that order from the bottom on both sides of the laminate T1 in the track width direction (the X direction) and on the lower shield layer 21 (refer to FIG. 5).

The lift-off resist layer 30 is removed, and the upper shield layer 26 is formed on the laminate T1 and the upper insulating layer 24.

The method for manufacturing the tunneling magnetic sensing element includes the annealing treatment in the formation process. A typical annealing treatment is an annealing treatment for generating an exchange coupling field (Hex) between the antiferromagnetic layer 3 and the first pinned magnetic layer 4a.

In the enhancing layer 6, element diffusion of Fe from the first enhancing layer 6a having a high concentration to the second enhancing layer 6b is effected by the above-described annealing treatment so that the concentration gradient of Fe is formed in the enhancing layer 6 (refer to FIG. 2).

Where the barrier layer 5 is formed by oxidation of the metal layer 15, examples of oxidation methods include radical oxidation, ion oxidation, plasma oxidation, and natural oxidation.

According to the above-described method, an appropriate tunneling magnetoresistive element may be simply produced that is capable of increasing the rate of change in resistance (ΔR/R) and suppressing an increase of the magnetostriction λ of the free magnetic layer as compared with those of the known tunneling magnetic sensing element can be produced.

In particular, since the first enhancing layer 6a having a large Fe content is formed on the barrier layer 5 after the oxidation treatment of the metal layer 15 as shown in FIG. 3 is performed, the first enhancing layer 6a is difficult to be affected by the oxidation and a high spin polarizability can be maintained. Consequently, a tunneling magnetic sensing element having a high rate of change in resistance (ΔR/R) described above can be produced effectively.

In the present embodiment, it is preferable that the metal layer 15 is formed from Ti or Al, an oxidation treatment is performed and, thereby, the barrier layer 5 composed of Ti—O or Al—O is formed.

When the above-described barrier layer 5 is formed from titanium oxide (Ti—O), the Fe content of the first enhancing layer 6a may be specified to be between 50 and 100 atomic percent, and furthermore, the Fe content of the second enhancing layer 6b may be specified to be between 0 and 50 atomic percent because a high rate of change in resistance (ΔR/R) can be obtained and, in addition, the magnetostriction λ (absolute value) of the free magnetic layer 8 can be controlled at a low level.

When the barrier layer 5 is formed from aluminum oxide (Al—O), the Fe content of the first enhancing layer 6a may be specified to be between 40 and 100 atomic percent, and furthermore, the Fe content of the second enhancing layer 6b may be specified to be between 0 and 39 atomic percent because a high rate of change in resistance (ΔR/R) can be obtained and, in addition, the magnetostriction λ (absolute value) of the free magnetic layer 8 can be controlled at a low level.

EXAMPLES

The tunneling magnetic sensing element as shown in FIG. 1 was formed.

In the laminate T1, the order of lamination was substrate layer 1: Ta (80)/seed layer 2: NiFeCr (50)/antiferromagnetic layer 3: IrMn (70)/pinned magnetic layer 4 first pinned magnetic layer 4a: $Co_{70}Fe_{30}$ (14)/nonmagnetic intermediate layer 4b: Ru (8.5)/second pinned magnetic layer 4c: $Co_{90}Fe_{10}$ (18)]/barrier layer 5/free magnetic layer 8 [first enhancing layer 6a/second enhancing layer 6b/soft magnetic layer 7]/protective layer 9: Ta (200) from the bottom. A numerical subscript is expressed in atomic percent, and a numerical value in parentheses indicates an average film thickness in Å.

After the laminate T1 was formed, an annealing treatment was performed at 270° C. for 3.5 hours. It is believed that the first enhancing layer 6a and the second enhancing layer 6b were principally maintained to be two layers.

The examples in the case where the above-described barrier layer 5 is Ti—O will be described. In the following examples, a numerical subscript is expressed in atomic percent.

The barrier layer 5 composed of Ti—O was formed on the pinned magnetic layer 4. Furthermore, two CoFe alloy layers having different Fe contents were formed on the barrier layer 5 to form the first enhancing layer 6a and the second enhancing layer 6b, and a film of $Ni_{86}Fe_{14}$ (in Example 2, $Ni_{83.5}Fe_{16.5}$) having a thickness of 50 Å was formed on the second enhancing layer 6b to form the soft magnetic layer 7, so that the free magnetic layer 8 was formed.

The results of measurement of the rate of change in resistance (ΔR/R) and the magnetostriction λ of the free magnetic layer 8 are shown in Table 1 together with the Fe content (atomic percent) in the CoFe alloy constituting the first enhancing layer 6a and the second enhancing layer 6b and the thickness (Å) of the film formed.

In Comparative example 1 shown in Table 1, only one enhancing layer was formed. In this case, the soft magnetic layer having a film thickness of 40 Å was formed from NiFe having a Ni content of 81.5 atomic percent.

higher than the Fe content of the second enhancing layer 6b, each of the rate of change in resistance (ΔR/R) was about 20%. Therefore, a high rate of change in resistance (ΔR/R) was obtained as compared with Comparative example 1 (the rate of change in resistance (ΔR/R): 13.6%), in which only one enhancing layer was formed.

With respect to the magnetostriction λ, the magnetostrictions λ of the free magnetic layers of Examples 1 to 3 are 3.3 to 4.0 ppm, and slightly increase as compared with the magnetostriction λ, 2.6 ppm, of the free magnetic layer of Comparative example 1. However, the amounts of increase are small and are within an acceptable range. Here, with respect to the case where two enhancing layers are formed, when the Fe content relative to the entire enhancing layers is calculated from the Fe content and the film thickness of each of the enhancing layers, for example, the Fe content results in 60 atomic percent (film thickness 10 Å) in Example 3.

It is estimated from the graph shown in FIG. 7A that when one enhancing layer (10 Å) is formed from a CoFe alloy having a Fe content of 60 atomic percent, the magnetostriction λ of the free magnetic layer becomes about 5 ppm. However, since the magnetostriction λ of the free magnetic layer in Example 3 was 3.3 ppm, it is clear that an increase of the magnetostriction λ of the free magnetic layer can be suppressed by forming two enhancing layers and decreasing the Fe content on the soft magnetic layer side. The same goes for other Examples:

The example in the case where the barrier layer 5 is formed from Al—O will be described. In the following example, a numerical subscript is expressed in atomic percent.

The barrier layer 5 composed of Al—O was formed on the pinned magnetic layer 4. Furthermore, on the barrier layer 5, the first enhancing layer 6a was formed from a CoFe alloy having a Fe content of 50 atomic percent and the second enhancing layer 6b was formed from a CoFe alloy having a Fe content of 10 atomic percent. A film of $Ni_{83.5}Fe_{16.5}$ having a thickness of 50 Å was formed on the second enhancing layer 6b, so as to form the soft magnetic layer 7. In the case where the barrier layer was Al—O, the second pinned magnetic layer 4c was formed from $Co_{60}Fe_{20}B_{20}$. B indicates boron.

The results of measurement of the rate of change in resistance (ΔR/R) and the magnetostriction λ of the free magnetic layer are shown in Table 2.

In Comparative example 2 shown in Table 2, only one enhancing layer was formed from a CoFe alloy having a Fe

TABLE 1

| | First enhancing layer | | Second enhancing layer | | | | |
|---|---|---|---|---|---|---|---|
| | Fe content (atomic percent) | Film thickness (Å) | Fe content (atomic percent) | Film thickness (Å) | RA (Ωμm²) | ΔR/R (%) | λ (ppm) |
| Example 1 | 100 | 6 | 10 | 4 | 1.2 | 20.2 | 3.3 |
| Example 2 | 100 | 4 | 10 | 6 | 1.3 | 19.7 | 4.0 |
| Example 3 | 100 | 2 | 50 | 8 | 1.1 | 20.0 | 3.3 |
| Comparative example 1 | 10 | 10 | None | 0 | 1.2 | 13.6 | 2.6 |

As shown in Table 1, with respect to Examples 1 to 3 in which two enhancing layers were formed and the Fe content of the first enhancing layer 6a on the barrier layer side was content of 30 atomic percent, and the Comparative example 2 is the same as Example 4 except the composition of the enhancing layer.

TABLE 2

|  | First enhancing layer | | Second enhancing layer | | | | |
| --- | --- | --- | --- | --- | --- | --- | --- |
|  | Fe content (atomic percent) | Film thickness (Å) | Fe content (atomic percent) | Film thickness (Å) | RA (Ωμm$^2$) | ΔR/R (%) | λ (ppm) |
| Example 4 | 50 | 6 | 10 | 4 | 1.9 | 23.7 | 3.6 |
| Comparative example 2 | 30 | 10 | None | 0 | 1.9 | 20.0 | 3.6 |

As is clear from Table 2, when Example 4 is compared with Comparative example 2, although the magnetostriction λ of the free magnetic layer is the same, the rate of change in resistance (ΔR/R) is improved. With respect to Example 4, when the Fe content relative to the entire enhancing layers is calculated from the Fe content and the film thickness of each of the enhancing layers, the Fe content results in 34 atomic percent. On the other hand, the Fe content of Comparative example 2 is 30 atomic percent. Since the film thicknesses of enhancing layers in both of Example 4 and Comparative example 2 are equal and are 10 Å, the Fe content in the entire enhancing layers of Example 4 is 4% larger than that of Comparative example 2. It may be believed that the rate of change in resistance (ΔR/R) of Example 4 is larger than the rate of change in resistance (ΔR/R) of Comparative example 2 because the Fe content is high in the former. However, considering that the magnetostriction λ of the free magnetic layer of Example 4 does not increase as compared with the magnetostriction λ of Comparative example 2, it is believed that the rate of change in resistance (ΔR/R) is improved without increasing the magnetostriction λ, as described above, because the Fe content of the enhancing layer on the barrier layer side is high.

What is claimed is:

1. A tunneling magnetic sensing element, comprising:
a first magnetic layer,
a barrier layer, and
a second magnetic layer,
wherein the first magnetic layer, the barrier layer, and the second magnetic layer are laminated in that order from the bottom, any one of the first magnetic layer and the second magnetic layer comprises a pinned magnetic layer with a pinned magnetization direction, and the other comprises a free magnetic layer with a magnetization direction being varied by an external magnetic field,
wherein the free magnetic layer comprises a soft magnetic layer and an enhancing layer having a film thickness smaller than that of the soft magnetic layer and interposed between the soft magnetic layer and the barrier layer, and
wherein the enhancing layer is formed from a cobalt iron (CoFe) alloy, and an Fe content of the enhancing layer is larger on a first side that interfaces with the barrier layer than on a second side that interfaces with the soft magnetic layer.

2. The tunneling magnetic sensing element according to claim 1, wherein the Fe composition ratio gradually decreases from a first interface between the barrier layer and the enhancing layer toward a second interface between the soft magnetic layer and the enhancing layer.

3. The tunneling magnetic sensing element according to claim 1, wherein the enhancing layer comprises a laminated structure including at least a first enhancing layer in contact with the barrier layer and a second enhancing layer in contact with the soft magnetic layer, wherein a first Fe content of the first enhancing layer is larger than a second Fe content of the other enhancing layers that include the second enhancing layer.

4. The tunneling magnetic sensing element according to claim 3, wherein the barrier layer is formed from titanium oxide (Ti—O), and a third Fe content on the side of the interface between the barrier layer and the first enhancing layer or the first Fe content of the first enhancing layer comprises between 50 and 100 atomic percent.

5. The tunneling magnetic sensing element according to claim 4, wherein a fourth Fe content on the side of the interface between the soft magnetic layer and the second enhancing layer or a second Fe content of the second enhancing layer comprises between 0 and 50 atomic percent.

6. The tunneling magnetic sensing element according to claim 3, wherein the barrier layer is formed from aluminum oxide (Al—O), and the third Fe content on the side of the interface between the barrier layer and the first enhancing layer or the first Fe content of the first enhancing layer comprises between 40 and 100 atomic percent.

7. The tunneling magnetic sensing element according to claim 6, wherein the fourth Fe content on the side of the interface between the soft magnetic layer and the second enhancing layer or the second Fe content of the second enhancing layer comprises between 0 and 39 atomic percent.

8. The tunneling magnetic sensing element according to claim 1, wherein the first magnetic layer is a pinned magnetic layer, and the second magnetic layer is a free magnetic layer.

9. The tunneling magnetic sensing element according to claim 1, wherein the total film thickness of the enhancing layer comprises between 6 to 20 Å.

* * * * *